(12) United States Patent
Gondaira et al.

(10) Patent No.: US 11,609,493 B2
(45) Date of Patent: Mar. 21, 2023

(54) PHOTOSENSITIVE RESIN COMPOSITION, SOLDER RESIST FILM USING SAID PHOTOSENSITIVE RESIN COMPOSITION, FLEXIBLE PRINTED CIRCUIT AND IMAGE DISPLAY DEVICE

(71) Applicant: ARISAWA MFG. CO., LTD., Joetsu (JP)

(72) Inventors: Takashi Gondaira, Joetsu (JP); Makoto Tai, Joetsu (JP)

(73) Assignee: ARISAWA MFG. CO., LTD., Niigata (JP)

( * ) Notice: Subject to any disclaimer, the term of this patent is extended or adjusted under 35 U.S.C. 154(b) by 880 days.

(21) Appl. No.: 16/483,990

(22) PCT Filed: Feb. 6, 2018

(86) PCT No.: PCT/JP2018/004100
§ 371 (c)(1),
(2) Date: Aug. 6, 2019

(87) PCT Pub. No.: WO2018/147295
PCT Pub. Date: Aug. 16, 2018

(65) Prior Publication Data
US 2020/0019054 A1 Jan. 16, 2020

(30) Foreign Application Priority Data
Feb. 7, 2017 (JP) .............................. JP2017-020628
Nov. 9, 2017 (JP) .............................. JP2017-216564

(51) Int. Cl.
| | | |
|---|---|---|
| G03F 7/00 | (2006.01) | |
| C08F 2/46 | (2006.01) | |
| C08F 2/50 | (2006.01) | |
| C08G 61/04 | (2006.01) | |
| G03F 7/004 | (2006.01) | |
| C08K 5/00 | (2006.01) | |
| C08K 5/29 | (2006.01) | |
| C08K 5/5397 | (2006.01) | |
| C08L 33/06 | (2006.01) | |
| H05K 3/28 | (2006.01) | |

(52) U.S. Cl.
CPC ............ *G03F 7/004* (2013.01); *C08K 5/0041* (2013.01); *C08K 5/29* (2013.01); *C08K 5/5397* (2013.01); *C08L 33/068* (2013.01); *H05K 3/28* (2013.01); *C08L 2203/20* (2013.01)

(58) Field of Classification Search
CPC . G03F 7/027; G03F 7/40; G03F 7/105; G03F 7/004; C08K 5/0041; C08K 5/5397; C08K 5/29; C08L 2203/20; H05K 3/287; H05K 3/28; H05K 3/3452; H05K 1/0274; H05K 1/0218; H05K 1/0393; H05K 2201/0761; H05K 2201/0715

USPC ........ 430/281.1, 270.1, 269; 522/6, 71, 189, 522/184, 1; 520/1
See application file for complete search history.

(56) References Cited

U.S. PATENT DOCUMENTS

| | | | |
|---|---|---|---|
| 10,627,716 B2 * | 4/2020 | Gondaira | G03F 7/039 |
| 11,402,754 B2 * | 8/2022 | Gondaira | H05K 3/287 |
| 2011/0021679 A1 | 1/2011 | Takahashi et al. | |
| 2013/0256017 A1 | 10/2013 | Okamoto et al. | |
| 2014/0158412 A1 | 6/2014 | Kido et al. | |
| 2014/0200320 A1 | 7/2014 | Sakamoto et al. | |
| 2018/0094095 A1 * | 4/2018 | Takahashi | C08G 18/76 |

FOREIGN PATENT DOCUMENTS

| | | |
|---|---|---|
| CN | 101535896 | 9/2009 |
| CN | 102272677 | 12/2011 |
| CN | 102414617 | 4/2012 |
| CN | 102472967 | 5/2012 |
| CN | 102736415 | 10/2012 |
| CN | 103582626 | 2/2014 |
| JP | H11-44954 A | 2/1999 |
| JP | H11-80294 A | 3/1999 |
| JP | H11-95428 A | 4/1999 |
| JP | 2005-232438 A | 9/2005 |

(Continued)

OTHER PUBLICATIONS

Shibazaki et al, JP 2013-137573 Machine Translation, Jul. 11, 2013 (Year: 2013).*
The extended European search report issued for the corresponding European Patent Application No. 18751077.1, dated Oct. 19, 2020, 7 pages.
The extended European search report issued for the corresponding European Patent Application No. 17895990.4, dated Oct. 19, 2020, 7 pages.
Office Action issued for Korean patent application No. 10-2019-7023050, dated Apr. 2, 2021, 13 pages including machine translation.
Office Action issued for Taiwanese Patent Application No. 107104315 , dated Jan. 11, 2021, 6 pages including English translation.

(Continued)

*Primary Examiner* — Jessica Whiteley
(74) *Attorney, Agent, or Firm* — Hamre, Schumann, Mueller & Larson, P.C.

(57) ABSTRACT

This photosensitive resin composition comprises: a photosensitive prepolymer having a carboxyl group and an ethylenically unsaturated group; a photopolymerization initiator; a thermosetting agent; and a pigment. The thermosetting agent is a polycarbodiimide compound represented by formula (1), in which a carbodiimide group is protected by an amino group that dissociates at temperatures of 80□ or greater. The polycarbodiimide compound has a weight average molecular weight of 300-3000, and a carbodiimide equivalent weight of 150-600. When formed into a film having a dry film thickness of 10-40 μm, the maximum value of the transmittance of the photosensitive resin composition is at least 7% for the transmission spectrum of at least some of the wavelength from 350-430 nm. (In formula (1), $R^1$, $R^2$, $X^1$, $X^2$, and n are as defined in the description.)

11 Claims, No Drawings

(56) References Cited

FOREIGN PATENT DOCUMENTS

| | | | | |
|---|---|---|---|---|
| JP | 2006-96962 A | 4/2006 | | |
| JP | 2009-198966 | 9/2009 | | |
| JP | 2009-235278 A | 10/2009 | | |
| JP | 2013137573 | * 7/2013 | | |
| JP | 5352175 B2 | 8/2013 | | |
| JP | 5380034 B2 | 10/2013 | | |
| JP | 5586729 B2 | 8/2014 | | |
| JP | 2015-92229 A | 5/2015 | | |
| JP | 2016-149388 A | 8/2016 | | |
| KR | 2010-0109442 | 10/2010 | | |
| KR | 2012-0086698 | 8/2012 | | |
| TW | 200844657 | 11/2008 | | |
| TW | 201410462 | 3/2014 | | |
| TW | 201700537 | 1/2017 | | |
| WO | 2012/029468 A1 | 3/2012 | | |
| WO | WO-2016060411 A | * 4/2016 | ............... | C07H 1/00 |
| WO | 2016/163285 A1 | 10/2016 | | |

OTHER PUBLICATIONS

Office Action issued for the Japanese patent application No. 2018-567448, dated Jan. 19, 2021, 3 pages including machine translation.

International Search Report for corresponding international application PCT/JP2018/004100 dated Apr. 24, 2018.

International Search Report for corresponding international application PCT/JP2017/007954 dated May 30, 2017.

The Written Opinion for corresponding international application PCT/JP2018/004100 dated Apr. 24, 2018.

The Written Opinion for corresponding international application PCT/JP2017/007954 dated May 30, 2017.

Office Action issued for Chinese Patent Application No. 201880010375.2, dated Sep. 5, 2022, 10 pages including English translation.

Office Action issued for Chinese Patent Application No. 201780085768.5, dated Aug. 26, 2022, 11 pages including English translation.

* cited by examiner

PHOTOSENSITIVE RESIN COMPOSITION, SOLDER RESIST FILM USING SAID PHOTOSENSITIVE RESIN COMPOSITION, FLEXIBLE PRINTED CIRCUIT AND IMAGE DISPLAY DEVICE

CROSS REFERENCE TO RELATED APPLICATION

This application claims the priority of Japanese Patent Application No. 2017-020628, filed on Feb. 7, 2017 and Japanese Patent Application No. 2017-216564 filed on Nov. 9, 2017, in the Japanese Patent Office. Further, this application is the National Phase Application of International Application No. PCT/JP2018/004100, filed on Feb. 6, 2018, which designates the United States and was published in Japan. Both of the priority documents are hereby incorporated by reference in their entireties.

TECHNICAL FIELD

The present invention relates to a photosensitive resin composition, and particularly to a photosensitive resin composition used for a dry film resist used in a flexible printed circuit, a solder resist film using the photosensitive resin composition, a flexible printed circuit and an image display device including the flexible printed circuit.

BACKGROUND ART

Flexible printed circuits (FPC) have features such as flexibility and bending properties, and are widely used to incorporate circuits into complex mechanisms in various electronic devices such as mobile phones, video cameras, and laptops, which are rapidly becoming smaller, lighter and thinner.

The FPC is formed of a copper clad laminate (CCL) having a circuit formed by etching process and a cover coat material. The solder resist used as a cover coat material usually makes a wiring pattern made of a conductive material in the wiring board inconspicuous, and in order to prevent irregular reflection of light on the resist surface, black color is used to absorb visible light.

In the related art, black inorganic pigments such as carbon black and black metal oxides have been used as a colorant for blackening a solder resist. However, since carbon black and black metal oxides have high electric conductivity, the function of the solder resist as an insulator may be deteriorated. In addition, the black inorganic pigment exhibits absorption wavelengths from the ultraviolet region to the infrared region. The exposure light for photo-curing a photosensitive resin composition forming the solder resist is absorbed by the black inorganic pigment, and there is a problem that the exposure sensitivity and the resolution (patterning properties) are low since the inner layer may not be sufficiently cured while the surface layer of the solder resist layer may be cured.

Therefore, various studies have been made to maintain the photocurability and improve the resolution while blackening the photosensitive resin composition forming the solder resist. For example, Patent Literatures 1 to 3 propose a photosensitive resin composition containing a specific colorant.

CITATION LIST

Patent Literature

Patent Literature 1: Japanese Patent No. 5380034
Patent Literature 2: Japanese Patent No. 5352175
Patent Literature 3: Japanese Patent No. 5586729

SUMMARY OF INVENTION

Technical Problem

The photosensitive resin composition described in Patent Literatures 1 to 3 is excellent in the concealability and resolution of the wiring pattern, but is still not sufficient from the level required with the recent technological progress, so that development of a new photosensitive resin composition is desired.

Therefore, an object of the present invention is to provide a novel photosensitive resin composition which is excellent in concealability of the wiring pattern and enhances resolution (patterning properties) of the wiring pattern, a solder resist film using the photosensitive resin composition, a flexible printed circuit and an image display device.

Solution to Problem

In order to solve the above problems, the inventors of the present invention have conducted intensive studies, and as a result, it is found that the above problems can be solved by using a photosensitive resin composition containing a photosensitive prepolymer, a photopolymerization initiator, a thermosetting agent and a pigment, in which a polycarbodiimide compound having specific physical properties is used as the thermosetting agent, and the transmittance of the photosensitive resin composition at a specific wavelength (specifically, at least a part of a wavelength range of 350 nm to 430 nm) is set to a certain value or more. Thus, the present invention has been completed.

That is, the present invention relates to the following <1> to <12>.

<1> A photosensitive resin composition containing:
a photosensitive prepolymer having a carboxyl group and an ethylenically unsaturated group;
a photopolymerization initiator;
a thermosetting agent; and
a pigment,
wherein the thermosetting agent is a polycarbodiimide compound represented by the following Formula (1) in which carbodiimide group is protected by an amino group dissociating at a temperature of 80° C. or higher, the polycarbodiimide compound having a weight average molecular weight of 300 to 3,000 and a carbodiimide equivalent of 150 to 600, and
wherein a maximum value of a transmittance of the photosensitive resin composition is 7% or more for a transmission spectrum of at least a part of a wavelength range of 350 nm to 430 nm when formed to a film having a dry film thickness of 10 μm to 40 μm.

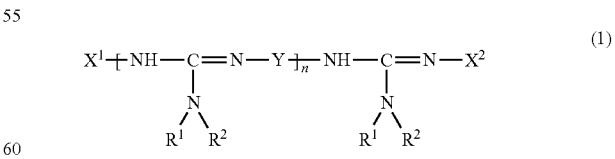

In Formula (1), $R^1$ and $R^2$ each independently represents a hydrogen atom, a linear or branched alkyl group having 1 to 6 carbon atoms, or a cycloalkyl group having 3 to 6 carbon atoms, $R^1$ and $R^2$ may be same as or different from each other, but both of them are not hydrogen atoms at the same time;

$X^1$ and $X^2$ each represents —$R^3$—NH—COO$R^4$, $R^3$ being a divalent organic group having at least one aromatic group and $R^4$ being a residue obtained by removing a hydroxy group from an organic group having one hydroxy group, and $X^1$ and $X^2$ being same as or different from each other; and Y represents —$R^5$—NHCOO—$R^6$—OCOHN—$R^5$—, each $R^5$ being independently a divalent organic group having at least one aromatic group and $R^6$ being a divalent organic group. $R^6$ is not an ether bond. n represents an integer of 1 to 5.

<2> The photosensitive resin composition according to <1>, wherein a brightness L* in an L*a*b* color system is 30 or less when the photosensitive resin composition is formed to the film having a dry film thickness of 10 μm to 40 μm.

<3> The photosensitive resin composition according to <1> or <2>, wherein a brightness L* in the L*a*b* color system is 30 or less at a surface of the film of the photosensitive resin composition having a cured film thickness of 10 μm to 40 μm formed on a glossy side of a copper foil.

<4> The photosensitive resin composition according to any one of <1> to <3>, wherein the pigment contains, as a main pigment, at least one selected from the group consisting of C. I. Pigment Violet 3, C. I. Pigment Violet 15, C. I. Pigment Violet 19, C. I. Pigment Violet 23, C. I. Pigment Violet 29, C. I. Pigment Violet 37, C. I. Pigment Violet 50, azomethine azo black, and perylene black.

<5> The photosensitive resin composition according to <4>, wherein the pigment further contains, as a toning pigment, at least one selected from the group consisting of a yellow pigment, a blue pigment and a green pigment.

<6> The photosensitive resin composition according to any one of <1> to <5>, wherein the pigment is contained in an amount of 1.0 mass % to 7.0 mass % in terms of solid content with respect to a total solid content of the composition.

<7> The photosensitive resin composition according to any one of <1> to <6>, wherein the polycarbodiimide compound has 2 to 6 carbodiimide groups.

<8> The photosensitive resin composition according to <1> or <7>, wherein the carbodiimide equivalent of the polycarbodiimide compound is 0.9 to 1.3 equivalents with respect to the carboxyl group of the photosensitive prepolymer.

<9> The photosensitive resin composition according to any one of <1> to <8>, which is used for a solder resist film.

<10> A solder resist film containing the photosensitive resin composition according to any one of <1> to <9>.

<11> A flexible printed circuit including: an insulating layer; a wiring pattern made of a conductive material and provided on the insulating layer; and a solder resist layer provided on the wiring pattern, wherein the solder resist layer contains the photosensitive resin composition according to any one of <1> to <9>.

<12> An image display device, including the flexible printed circuit according to <11>.

Advantageous Effects of Invention

According to the photosensitive resin composition of the present invention, the concealability of the wiring pattern when performing lamination on the wiring pattern can be secured by the pigment, and since the maximum value of the transmittance of the photosensitive resin composition is 7% or more for a transmission spectrum of at least a part of a wavelength range of 350 nm to 430 nm when the photosensitive resin composition is formed to the film having a dry film thickness of 10 μm to 40 μm, excellent resolution can be exhibited during the photo-curing.

In addition, since the brightness L* of the film in the L*a*b* color system is 30 or less when the film is formed using the photosensitive resin composition of the present invention, the concealability of the wiring pattern can be further improved.

DESCRIPTION OF EMBODIMENTS

Although the embodiments of the present invention are described in detail, the present invention is not limited to the following embodiments, and can be implemented by various modifications within the scope of the present invention.

In the following embodiment, (meth)acrylic acid means acrylic acid or methacrylic acid, and the same applies to (meth)acrylate.

In this description, "mass" is synonymous with "weight".

In addition, an FPC is described below as an example, but the photosensitive resin composition of the present embodiment can also be used for semiconductor package applications (semiconductor PKG applications). In addition to the CCL having a circuit formed by etching process as described above, a substrate on which a circuit is formed by printing using a paste-like nano-ink containing conductive fine particles such as silver particles and copper particles can also be used as a substrate for the FPC. Hereinafter, the CCL also includes a substrate on which a circuit is formed by printing using the paste-like nano-ink containing conductive fine particles such as silver particles and copper particles.

The photosensitive resin composition of the present embodiment contains a photosensitive prepolymer having a carboxyl group and an ethylenically unsaturated group, a photopolymerization initiator, a thermosetting agent and a pigment. The thermosetting agent is a polycarbodiimide compound represented by the following Formula (1) in which carbodiimide group is protected by an amino group dissociating at a temperature of 80° C. or higher, and the polycarbodiimide compound has a weight average molecular weight of 300 to 3,000 and a carbodiimide equivalent of 150 to 600. Further, when the photosensitive resin composition of the present embodiment is formed to a film having a dry film thickness of 10 μm to 40 μm, a maximum value of a transmittance of the photosensitive resin composition is 7% or more for a transmission spectrum of at least a part of a wavelength range of 350 nm to 430 nm.

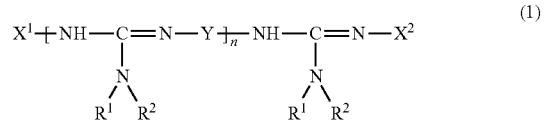

(1)

In Formula (1), $R^1$ and $R^2$ each independently represent a hydrogen atom, a linear or branched alkyl group having 1 to 6 carbon atoms, or a cycloalkyl group having 3 to 6 carbon atoms, $R^1$ and $R^2$ may be same as or different from each other, but both of them are not hydrogen atoms at the same time; $X^1$ and $X^2$ each represent —$R^3$—NH—COO$R^4$, $R^3$ being a divalent organic group having at least one aromatic group and $R^4$ being a residue obtained by removing a hydroxy group from an organic group having one hydroxy group, and $X^1$ and $X^2$ being same as or different from each other; and Y represents —$R^5$—NHCOO—$R^6$—OCOHN—$R^5$—, each $R^5$ being independently a divalent organic group having at least one aromatic group and $R^6$ being a divalent organic group. $R^6$ is not an ether bond. n represents an integer of 1 to 5.

Hereinafter, each component is to be described in detail.

(Photosensitive Prepolymer)

As the photosensitive prepolymer in the present embodiment, one having an ethylenically unsaturated end group derived from an acrylic monomer is preferably used. The acrylic monomer used here is an acrylic acid or methacrylic acid, or derivatives thereof such as alkyl esters and hydroxyalkyl esters thereof.

Examples of the photosensitive prepolymer include a polyester acrylate, an epoxy acrylate, a urethane acrylate, an acrylated acrylate, a polybutadiene acrylate, a silicone acrylate, and a melamine acrylate. Among these, an epoxy acrylate and a urethane acrylate are preferred from the viewpoint of being excellent in balance of flexibility, heat resistance and adhesiveness.

The photosensitive prepolymer of the present embodiment is not particularly limited as long as the above conditions are met, and one having both a carboxyl group and at least two ethylenically unsaturated groups in one molecule is used. Specifically, particularly preferable examples include an epoxy (meth)acrylate compound (EA) having a carboxyl group, or a urethane (meth)acrylate compound (UA) having a carboxyl group.

<Epoxy (Meth)Acrylate Compound (EA) Having Carboxyl Group>

The epoxy (meth)acrylate compound having a carboxyl group in the present embodiment is not particularly limited, and an epoxy (meth)acrylate compound obtained by reacting a reaction product of an epoxy compound and an unsaturated group-containing monocarboxylic acid with an acid anhydride is suitable.

The epoxy compound is not particularly limited and examples thereof include epoxy compounds such as a bisphenol A-type epoxy compound, a bisphenol F-type epoxy compound, a bisphenol S-type epoxy compound, a phenol novolac-type epoxy compound, a biphenyl-type epoxy compound, a cresol novolac-type epoxy compound, or an aliphatic epoxy compound. The epoxy compound may be used alone, or may be used in combination of two or more thereof. Among these, it is preferable to use a bisphenol F-type epoxy compound from the viewpoint of flexibility, and it is preferable to use a biphenyl-type epoxy compound from the viewpoint of insulation.

Examples of the unsaturated group-containing monocarboxylic acid include an acrylic acid, a dimer of an acrylic acid, a methacrylic acid, a β-furfuryl acrylic acid, a β-styryl acrylic acid, a cinnamic acid, a crotonic acid, and an α-cyanocinnamic acid. In addition, examples also include a reaction product of a hydroxy group-containing acrylate with a saturated or unsaturated dibasic acid anhydride, and a reaction product of an unsaturated group-containing monoglycidyl ether with a saturated or unsaturated dibasic acid anhydride. The unsaturated group-containing monocarboxylic acid may be used alone, or may be used in combination of two or more thereof.

Examples of the acid anhydride include: dibasic acid anhydrides such as maleic anhydride, succinic anhydride, itaconic anhydride, phthalic anhydride, tetrahydrophthalic anhydride, hexahydrophthalic anhydride, methyl hexahydrophthalic anhydride, endomethylene tetrahydrophthalic anhydride, methylendomethylenetetrahydrophthalic anhydride, chlorendic anhydride, and methyltetrahydrophthalic anhydride; aromatic polyvalent carboxylic anhydrides such as trimellitic anhydride, pyromellitic anhydride, and benzophenone tetracarboxylic acid dianhydride; and polyvalent carboxylic acid anhydride derivatives such as 5-(2,5-dioxotetrahydrofuryl)-3-methyl-3-cyclohexene-1,2-dicarboxylic anhydride and endobicyclo-[2,2,1]-hept-5-ene-2,3-dicarboxylic anhydride. The acid anhydride may be used alone, or may be used in combination of two or more thereof.

The molecular weight of the epoxy (meth)acrylate compound having a carboxyl group thus obtained is not particularly limited, and the weight average molecular weight is preferably 5,000 to 15,000, and more preferably 8,000 to 12,000. Here, the weight average molecular weight is a value measured using gel permeation chromatography in terms of polystyrene.

In addition, the acid value (solid content acid value) of the epoxy (meth)acrylate compound is preferably in the range of 30 mg KOH/g to 150 mg KOH/g, and more preferably in the range of 40 mg KOH/g to 100 mg KOH/g from the viewpoint of balance between developability and flexibility after curing. The solid content acid value is a value measured according to JIS K0070.

The epoxy (meth)acrylate compound having a carboxyl group may independently constitute a photosensitive prepolymer, or may be used in combination with a urethane (meth)acrylate compound having a carboxyl group to be described later. In this case, the epoxy (meth)acrylate compound having a carboxyl group is preferably used in an amount of 100 parts by mass or less with respect to 100 parts of the urethane (meth)acrylate compound having a carboxyl group.

<Urethane (Meth)Acrylate Compound (UA) Having Carboxyl Group>

The urethane (meth)acrylate compound having a carboxyl group in the present embodiment is a compound which contains a unit derived from a (meth)acrylate having a hydroxy group, a unit derived from a polyol, and a unit derived from polyisocyanate as structural units. Specifically, it includes a unit derived from a (meth)acrylate having hydroxy groups at both ends, between which a repeating unit including a unit derived from a polyol and a unit derived from a polyisocyanate, the units being linked by a urethane bond is present. A carboxyl group is present in the unit.

That is, the urethane (meth)acrylate compound having a carboxyl group is represented by the following formula.

—(OR$^{11}$O—CONHR$^{12}$NHCO)$_n$—

In the formula, n is an integer of 1 to 200, OR$^{11}$O is a dehydrogenation residue of a polyol, and R$^{12}$ is a deisocyanate residue of a polyisocyanate.

The urethane (meth)acrylate compound having a carboxyl group can be produced by reacting at least a (meth)acrylate having a hydroxy group, a polyol and a polyisocyanate, but here, it is necessary to use a compound having a carboxyl group for at least one of the polyol and the polyisocyanate. Preferably, a polyol having a carboxyl group is used. Thus, the urethane (meth)acrylate compound in which a carboxyl group is present in $R^{11}$ or $R^{12}$ can be produced by using the compound having a carboxyl group as a polyol and/or a polyisocyanate. In the above formula, n is preferably about 1 to 200, and more preferably 2 to 30. When n is within the above range, a cured film made of the photosensitive resin composition is more excellent in flexibility.

In addition, in a case where two or more of at least one of polyol and polyisocyanate are used, the repeating unit represents a plurality of types, but the regularity of the plurality of units can be appropriately selected depending on the purpose, such as perfect randomness, block, or localization.

Examples of the (meth)acrylate having a hydroxy group used in the present embodiment include ethanediol monoacrylate, propanediol monoacrylate, 1,3-propanediol monoacrylate, 1,4-butanediol monoacrylate, 1,6-hexanediol monoacrylate, 1,9-nonanediol monoacrylate, diethylene glycol monoacrylate, triethylene glycol monoacrylate, dipropylene glycol monoacrylate, 2,3-dihydroxypropyl acrylate, 3-(4-benzoyl-3-hydroxyphenoxy)-2-hydroxypropyl methacrylate, 2,3-dihydroxypropyl 2-methylpropenoic acid, 2-hydroxyethyl (meth)acrylate, hydroxypropyl (meth)acrylate, hydroxybutyl (meth)acrylate, caprolactone or alkylene oxide adducts of the above (meth)acrylates, glycerin mono (meth)acrylate, glycerin di(meth)acrylate, a glycidyl methacrylate-acrylic acid adduct, trimethylolpropane mono (meth)acrylate, trimethylol di(meth)acrylate, pentaerythritol tri(meth)acrylate, dipentaerythritol penta(meth)acrylate, ditrimethylolpropane tri(meth)acrylate, and trimethylolpropane-alkylene oxide adduct-di(meth)acrylate.

The (meth)acrylate having a hydroxy group may be used alone, or may be used in combination of two or more thereof.

A polymer polyol and/or a dihydroxy compound can be used as the polyol used in the present embodiment. Examples of the polymer polyol include: polyether-based diols such as polyethylene glycol, polypropylene glycol and polytetramethylene glycol; polyester-based polyols obtained from esters of polyhydric alcohols and polybasic acids; polycarbonate-based diols containing a unit derived from hexamethylene carbonate, and pentamethylene carbonate as a structural unit; and polylactone-based diols such as polycaprolactone diol and polybutyrolactone diol.

In addition, in a case of using a polymer polyol having a carboxyl group, for example, it is possible to use a compound synthesized such that trivalent or higher polybasic acids such as (anhydride) trimellitic acid are coexist and a carboxyl group remains during the above polymer polyol synthesis.

The polymer polyol may be used alone, or may be used in combination of two or more thereof. In addition, use of those having a weight average molecular weight of 200 to 2,000 as these polymer polyols is preferred since a cured film made of the photosensitive resin composition is more excellent in flexibility. Further, among these polymer polyols, use of a polycarbonate diol is preferred since a cured film made of the photosensitive resin composition is high in heat resistance and excellent in pressure cooker resistance. Further, it is more preferable that the structural unit of the polymer polyol is not only a single structural unit but also a plurality of structural units, since a cured film made of the photosensitive resin composition is further excellent in flexibility. Examples of such a polymer polyol including a plurality of structural units include polyether-based diols containing units derived from ethylene glycol and propylene glycol as structural units and polycarbonate diols containing units derived from hexamethylene carbonate and pentamethylene carbonate as structural units.

As the dihydroxy compound, a branched or linear compound having two alcoholic hydroxy groups can be used, and particularly a dihydroxy aliphatic carboxylic acid having a carboxyl group is preferably used. Examples of such a dihydroxy compound include dimethylol propionic acid and dimethylol butanoic acid. By using a dihydroxy aliphatic carboxylic acid having a carboxyl group, a carboxyl group can be easily present in the urethane (meth)acrylate compound.

The dihydroxy compound may be used alone, or may be used in combination of two or more thereof, and may be used in combination with the polymer polyol.

In a case of using the dihydroxy compound in combination with a polymer polyol having a carboxyl group, or in a case of using one having a carboxyl group as a polyisocyanate to be described later, a dihydroxy compound having no carboxyl group such as ethylene glycol, diethylene glycol, propylene glycol, 1,4-butanediol, 1,3-butanediol, 1,5-pentanediol, neopentyl glycol, 3-methyl-1,5-pentanediol, 1,6-hexanediol, 1,4-cyclohexanedimethanol, and hydroquinone may be used.

Specific examples of the polyisocyanate used in the present embodiment include diisocyanates such as 2,4-toluene diisocyanate, 2,6-toluene diisocyanate, isophorone diisocyanate, hexamethylene diisocyanate, diphenyl methylene diisocyanate, (o, m or p)-xylene diisocyanate, methylene bis(cyclohexyl isocyanate), trimethylhexamethylene diisocyanate, cyclohexane-1,3-dimethylene diisocyanate, cyclohexane-1,4-dimethylene diisocyanate and 1,5-naphthalene diisocyanate. The polyisocyanate may be used alone, or may be used in combination of two or more thereof. In addition, a polyisocyanate having a carboxyl group can also be used.

The molecular weight of the urethane (meth)acrylate compound having a carboxyl group used in the present embodiment is not particularly limited, and the weight average molecular weight (Mw) thereof is preferably, 1,000 to 30,000, and more preferably 8,000 to 20,000. When the weight average molecular weight of the urethane (meth)acrylate compound having a carboxyl group is 1,000 or more, a cured film made of the photosensitive resin composition is good in elongation and strength, and when the weight average molecular weight thereof is 30,000 or less, the cured film is good in flexibility.

In addition, the acid value of the urethane (meth)acrylate is preferably 30 mg KOH/g to 80 mg KOH/g, and more preferably 40 mg KOH/g to 60 mg KOH/g. When the acid value is 30 mg KOH/g or more, the alkali solubility of the photosensitive resin composition is good, and when the acid value is 80 mg KOH/g or less, the flexibility of the cured film is good.

The acid value of the urethane (meth)acrylate compound having a carboxyl group is preferably 30 mg KOH/g to 80 mg KOH/g, but even in this range, if the acid value is increased, the developability is improved, but the flexibility is likely to decrease; if the acid value is lowered, the flexibility is increased, but the developability is lowered and the developing residue is likely to generate. In this case, by using the urethane (meth)acrylate compound having at least two carboxyl group with different acid values in combination, a photosensitive resin composition having excellent flexibility and good developability can be easily obtained.

The urethane (meth)acrylate compound having a carboxyl group can be produced by: (1) a method of mixing and reacting a (meth)acrylate having a hydroxy group, a polyol, and a polyisocyanate; (2) a method of reacting a polyol and a polyisocyanate to produce a urethane isocyanate prepolymer having one or more isocyanate groups per molecule, and then reacting the urethane isocyanate prepolymer with a (meth)acrylate having a hydroxy group; and (3) a method of reacting a (meth)acrylate having a hydroxy group with a polyisocyanate to produce a urethane isocyanate prepolymer having one or more isocyanate groups per molecule, and then reacting the prepolymer with a polyol.

(Photopolymerization Initiator)

The photopolymerization initiator is not particularly limited and any known in the related art may be used. Specifically, representative examples include bis(2,4,6-trimethylbenzoyl)-phenylphosphine oxide, 2,4,6-trimethyl benzoyl diphenyl phosphine oxide, 1,2-octanedione, 1-[4-(phenylthio)phenyl-2-(O-benzoyloxime)], ethanone, 1-[9-ethyl-6-(2-methylbenzoyl)-9H-carbazol-3-yl]-, 1-(O-acetyloxime), 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone, benzoin, benzoin methyl ether, benzoin ethyl ether, benzoin isopropyl ether, benzoin n-butyl ether, benzoin isobutyl ether, acetophenone, dimethylaminoacetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexyl phenyl ketone, 2-methyl-1-[4-methylthio)phenyl]-2-morpholino-propan-1-one, 4-(2-hydroxyethoxy)phenyl-2-(hydroxy-2-propyl) ketone, benzophenone, p-phenyl benzophenone, 4,4'-diethylaminobenzophenone, dichlorobenzophenone, 2-methyl anthraquinone, 2-ethyl anthraquinone, 2-tert-butyl anthraquinone, 2-aminoanthraquinone, 2-methylthioxanthone, 2-ethylthioxanthone, 2-chlorothioxanthone, 2,4-dimethylthioxanthone, 2,4 diethylthioxanthone, benzyl dimethyl ketal, acetophenone dimethyl ketal, and ethyl p-dimethylaminobenzate. The photopolymerization initiator may be used alone, or may be used in combination of two or more thereof.

Among these, from the viewpoint of thick film curability, it is preferable to use bis(2,4,6-trimethylbenzoyl)-phenylphosphine oxide, 2,4,6-trimethyl benzoyl diphenyl phosphine oxide, 2-benzyl-2-dimethylamino-1-(4-morpholinophenyl)-butanone-1,2-(dimethylamino)-2-[(4-methylphenyl)methyl]-1-[4-(4-)morpholinyl)phenyl]-1-butanone, and thioxanthones.

The amount of the photopolymerization initiator to be used is preferably 2 parts by mass or more, more preferably 6 parts by mass or more, still more preferably 10 parts by mass or more, and is preferably 20 parts by mass or less, more preferably 16 parts by mass or less, still more preferably 14 parts by mass or less, with respect to 100 parts by mass of the photosensitive prepolymer. when the content of the photopolymerization initiator is 2 parts by mass or more with respect to 100 parts by mass of the photosensitive prepolymer, the photo-curing reaction of the photosensitive prepolymer easily proceeds. When the content thereof is 20 parts by mass or less, the curing reaction can be performed without causing the brittleness of the cured film and impairing the adhesion.

(Thermosetting Agent)

The thermosetting agent used in the present embodiment is a polycarbodiimide compound having a carbodiimide group which can react with the carboxyl group of the photosensitive prepolymer. The polycarbodiimide compound of the present embodiment is characterized in that the carbodiimide group in the structure thereof is protected by an amino group dissociating at a temperature of 80° C. or higher. "Protected" means that the carbodiimide group and the amino group are covalently bonded, but the bond is such that they are dissociated by heat.

Since the carbodiimide group (—N=C=N) has high reactivity with the carboxyl group and the reaction starts at the moment of mixing the carbodiimide group with the photosensitive prepolymer having the carboxyl group, the storage stability of the composition is poor, and it is not suitable for a dry resist film to be filmed at a temperature lower than 80° C., so that polycarbodiimide is not used in a photosensitive resin composition in the related art. That is, since polycarbodiimide cannot be present in the photosensitive resin composition as it is, a carbodiimide compound in which a carbodiimide group is protected by an amino group is used in the present embodiment.

Specifically, since the carbodiimide compound is heated and filmed at a temperature lower than 80° C. and thermal compression treatment such as heat lamination is performed also at a temperature lower than 80° C., the amino group is not dissociated from the carbodiimide group, and it is considered that accurate development can be performed at this time. Further, since the photosensitive resin composition of the present embodiment has appropriate fluidity during the thermal compression treatment, embedding of the pattern circuit in the FPC can be suitably performed. Thereafter, development treatment is performed to form an opening portion at a predetermined position. Then, when heating is performed at a temperature of 80° C. or higher at which the amino group dissociates, the amino group dissociates, the carbodiimide group reacts with the carboxyl group, and the photosensitive resin composition can be completely cured (C stage). The reaction of the carbodiimide group with the carboxyl group forms a structure called acylurea. By forming such a structure, the amount of unreacted carboxyl groups in the resin composition after curing is reduced, and migration resistance can also be obtained.

The amino group is not particularly limited as long as it can be dissociated from the carbodiimide group at a temperature of 80° C. or higher, and any of a primary amino group to a tertiary amino group can be used. Among these, it is preferable to use a primary amino group and a secondary amino group having an active hydrogen (that is, a primary amino group and a secondary amino group capable of releasing hydrogen by reaction) from the viewpoint of improving the stability after binding to a carbodiimide group. The bonding force with a carbodiimide group is increased by using an amino group having an active hydrogen.

The polycarbodiimide compound of the present embodiment is a compound represented by the following Formula (1).

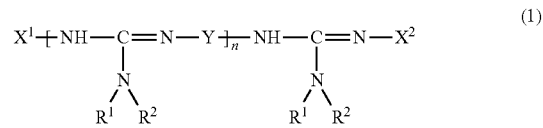

(1)

In Formula (1), $R^1$ and $R^2$ each independently represent a hydrogen atom, a linear or branched alkyl group having 1 to 6 carbon atoms, or a cycloalkyl group having 3 to 6 carbon atoms, $R^1$ and $R^2$ may be same as or different from each other, but both of them are not hydrogen atoms at the same time; $X^1$ and $X^2$ each represent —$R^3$—NH—COOR$^4$, $R^3$ being a divalent organic group having at least one aromatic group and $R^4$ being a residue obtained by removing a hydroxy group from an organic group having one hydroxy group, and $X^1$ and $X^2$ being same as or different from each other; and Y represents —$R^5$—NHCOO—$R^6$—OCOHN—$R^5$—, each $R^5$ being independently a divalent organic group having at least one aromatic group and $R^6$ being a divalent organic group. $R^6$ is not an ether bond. n represents an integer of 1 to 5.

In Formula (1), $R^1$ and $R^2$ each independently represent a hydrogen atom, a linear or branched alkyl group having 1 to 6 carbon atoms, or a cycloalkyl group having 3 to 6 carbon atoms. $R^1$ and $R^2$ linked to the same nitrogen atom may be same as or different from each other, but they are not both hydrogen atoms.

Examples of the linear or branched alkyl group having 1 to 6 carbon atoms include a methyl group, an ethyl group, a propyl group, an isopropyl group, an n-butyl group, a sec-butyl group, an isobutyl group, a tert-butyl group, a pentyl group, and a hexyl group. Examples of the cycloalkyl group having 3 to 6 carbon atoms include a cyclopropyl group, a cyclobutyl group, a cyclopentyl group, and a cyclohexyl group.

In a case where the amino group of the polycarbodiimide compound is a primary amine having two active hydrogens, the primary amine reacts with other carbodiimide groups to form a three-dimensional network structure and to gel. As a result, the compatibility with other components contained in the photosensitive resin composition may be reduced. Therefore, it is preferable to use a secondary amino group having one active hydrogen. Specifically, $R^1$ and $R^2$ each independently are more preferably a linear or branched alkyl group having 1 to 6 carbon atoms or a cycloalkyl group having 3 to 6 carbon atoms, and still more preferably an ethyl group, a methyl group, a propyl group, and an isopropyl group. Among these, it is particularly preferable that both $R^1$ and $R^2$ are propyl groups or isopropyl groups, and most preferably both are isopropyl groups.

In the present embodiment, the polycarbodiimide compound has a structure in which a carbodiimide group is protected by an amine From the viewpoint of compatibility with other components, the amine protecting the carbodiimide group is preferably a secondary amine in which a crosslinking reaction is less likely to occur. Examples of the secondary amine include dimethylamine, N-ethylmethylamine, N-methylpropylamine, N-methylbutylamine, N-methylpentylamine, N-hexylamine, N-methylcyclohexylamine, diethylamine, N-ethylpropylamine, N-ethylbutylamine, N-ethylpentylamine, N-ethylhexylamine, diisopropylamine, N-propylbutylamine, N-propylpentylamine, N-propylhexylamine, di-sec-butylamine, di-n-butylamine, and diisobutylamine.

As an amine used in the present embodiment, one having a boiling point of 160° C. or lower can be used suitably. When the carbodiimide group is protected by an amine having a boiling point of 160° C. or lower, the reaction with a carboxyl group at room temperature can be suppressed, and dissociation can occur in a temperature range of 80° C. to 200° C. The amine used is more preferably one having a boiling point of 50° C. to 140° C., and still more preferably one having a boiling point of 80° C. to 110° C. In a case of one having a boiling point of 80° C. to 110° C., the amine can be dissociated by heat treatment at 100° C. to 160° C.

Examples of the amine having a boiling point of 160° C. or lower include diethylamine, N-methylhexylamine, N-methylcyclohexylamine, di-n-butylamine, N-propylbutylamine, di-sec-butylamine, diisobutylamine, diisopropylamine, N-methylpentylamine, N-methylbutylamine, N-ethylbutylamine, N-methylpropylamine, and N-ethylpropylamine. Among these, examples of the amine having a boiling point of 50° C. to 140° C. include diethylamine, N-methylpropylamine, N-methylbutylamine, N-methylpentylamine, di-sec-butylamine, diisobutylamine, N-ethylpropylamine, N-ethylbutylamine, diisopropylamine, and N-propylbutylamine Among these, examples of the amine having a boiling point of 80° C. to 110° C. include N-ethylpropylamine, N-ethylbutylamine, N-methylbutylamine, and diisopropylamine.

In Formula (1), $X^1$ and $X^2$ each represent —$R^3$—NH—COO$R^4$. Here, $R^3$ is a divalent organic group having at least one aromatic group, $R^4$ is a residue obtained by removing a hydroxy group from an organic group having one hydroxy group, and $X^1$ and $X^2$ may be same as or different from each other.

Examples of the divalent organic group having at least one aromatic group represented by $R^3$ include a divalent residue obtained by removing two —OCN groups from an aromatic diisocyanate having at least one aromatic group. Examples of the aromatic diisocyanate include 4,4'-diphenylmethane diisocyanate, 4,4'-diphenylether diisocyanate, p-phenylene diisocyanate, m-phenylene diisocyanate, 3,3'-dimethoxy-4,4'-biphenyl diisocyanate, o-tolidine diisocyanate, naphthalene diisocyanate, 2,4-tolylene diisocyanate, 2,6-tolylene diisocyanate, 3,3'-dimethoxy-4,4'-diphenylmethane diisocyanate, and 3,3'-dimethyl-4,4'-diphenylether diisocyanate. The above aromatic diisocyanate may be used alone, or may be used in combination of two or more thereof.

Among these, a divalent residue obtained by removing two —OCN groups from 4,4'-diphenylmethane diisocyanate, 2,4-tolylene diisocyanate or 2,6-tolylene diisocyanate is preferred from the viewpoint of high versatility of industrial raw materials.

Examples of the residue obtained by removing a hydroxy group from an organic group having one hydroxy group represented by $R^4$ is not particularly limited as long as it is a residue obtained by removing a hydroxy group from an organic group having no reactivity with the isocyanate group other than the hydroxy group, which does not inhibit the reaction of the hydroxy group of the organic group having one hydroxy group with the isocyanate group. Examples of the organic group having no reactivity with the isocyanate group other than the hydroxy group include hydroxyalkyl groups such as a hydroxymethyl group, a hydroxyethyl group, a hydroxypropyl group, and a hydroxybutyl group, a hydroxy ester group, a hydroxy ether group, and a hydroxy alkylene oxide group. Examples of the residue obtained by removing a hydroxy group from an organic group having no reactivity with the isocyanate group other than the hydroxy group include an alkyl group, an ester group, an ether group, and an alkylene oxide group. Specifically, in a case where the organic group having one hydroxy group is a hydroxymethyl group, the residue obtained by removing a hydroxy group from the hydroxymethyl group is a methyl group, and in a case of a hydroxyethyl group, the residue obtained by removing a hydroxy group from the hydroxyethyl group is an ethyl group.

In the present embodiment, $R^4$ is preferably an alkyl group which is a residue obtained by removing a hydroxy group from a hydroxyalkyl group, and more preferably a methyl group or an ethyl group.

In Formula (1), Y represents —$R^5$—NHCOO—$R^6$—OCOHN—$R^5$—. Here, each $R^5$ is independently a divalent organic group having at least one aromatic group and $R^6$ is a divalent organic group. $R^6$ is not an ether bond.

Examples of the divalent organic group having at least one aromatic group represented by $R^5$ include a divalent residue obtained by removing two —OCN groups from an aromatic diisocyanate having at least one aromatic group similar to $R^3$ described above, and specific examples and preferred examples thereof are also similar.

Examples of the divalent organic group represented by $R^6$ include an ester bond, a carbonate group, and a group having a conjugated diene structure. In a case where $R^6$ is an ether bond, there is a risk that sufficient migration resistance cannot be obtained since the ether bond is hydrophilic. Thus, $R^6$ cannot be an ether bond.

Specific examples of the divalent organic group represented by $R^6$ include a divalent residue obtained by removing two hydroxy groups from a diol compound. Examples of the diol compound include a low molecular weight diol or polyalkylene diol, a polycarbonate diol, a castor oil-based diol, and a polyester diol.

The low molecular weight diol or polyalkylene diol is a compound having two hydroxy groups in one molecule and examples thereof include ethylene glycol, 1,2-propanediol, 1,3-propanediol, 2-methyl-1,3-propanediol, 2,2-dimethyl-1,3-propanediol, 2,2-diethyl-1,3-propanediol, 2-butyl-2-ethyl-1,3-propanediol, 2-benzylene-2-propyl-1,3-propanediol, 1,2-butanediol, 1,3-butanediol, 1,4-butanediol, 1,5-pentanediol, 1,5-hexanediol, 1,6-hexanediol, 3-methyl-1,5-pentanediol, 2-ethyl-1,3-hexanediol, and 2,2,4-trimethyl-1,3-pentandiol.

Examples of the polycarbonate diol include a reaction product of a diol and a carbonate. Examples of the carbonate in producing a polycarbonate diol include: dialkyl carbonates such as dimethyl carbonate, diethyl carbonate, dipropyl carbonate, and dibutyl carbonate; diaryl carbonates such as diphenyl carbonate; and alkylene carbonates such as ethylene carbonate, trimethylene carbonate, 1,2-propylene carbonate, 1,2-butylene carbonate, 1,3-butylene carbonate, and 1,2-pentylene carbonate.

Examples of the castor oil-based diol include a castor oil fatty acid ester-based diol, and specific examples thereof include: castor oil; and castor oil fatty acid ester obtained by an ester exchange reaction of the above low molecular weight diol or diether polyol with castor oil or by an esterification reaction of the above low molecular weight diol or diether polyol with castor oil fatty acid.

Examples of the polyester diol include: a linear or branched polyester diol from a polycarboxylic acid [an aliphatic saturated or unsaturated polycarboxylic acid (adipic acid, azelaic acid, dodecanoic acid, maleic acid, fumaric acid, itaconic acid, and dimerized linoleic acid, or the like) and/or aromatic dicarboxylic acid (phthalic acid, isophthalic acid, or the like)] and a diol (the above low molecular weight diol); a polylactone diol [for example, a polyol (for example, polycaprolactone diol) obtained by addition polymerization of (substituted) caprolactone (ε-caprolactone, α-methyl-ε-caprolactone, ε-methyl-ε-caprolactone or the like) to one or more low molecular weight diols as an initiator in the presence of a catalyst (an organic metal compounds, a metal chelate compound, a fatty acid metal acylate, or the like)]; and a polycarbonate polyol obtained by addition polymerization of alkylene oxide (ethylene oxide, propylene oxide, or the like) to a polyester having a carboxyl group and/or an OH group on the end of the polymer.

Among these, from the viewpoint of improving migration resistance, the divalent organic group represented by $R^6$ is preferably a castor oil-based diol residue (residue obtained by removing two hydroxy groups from a castor oil-based structure), a low molecular weight diol residue, a polyalkylenediol residue, and a polycarbonate diol residue and more preferably a castor oil-based diol residue, a propanediol residue (—$(CH_2)_3$—), a butanediol residue (—$(CH_2)_4$—), and a polycarbonate diol residue (specifically, —O—C(=O)—O—$(CH_2)_m$—, m=3, 4).

In Formula (1), n is an integer of 1 to 5. In the present embodiment, since the number of the carbodiimide group in the polycarbodiimide compound is preferably 2 or more from the viewpoint of obtaining a crosslinked product, the above effect can be exhibited when n is 1 or more.

In other words, the number of the carbodiimide group is 2 to 6, and from the viewpoint of hardly causing warping during the curing of the photosensitive resin composition, the number of the carbodiimide group is preferably 2 to 5.

In the present embodiment, as a preferred polycarbodiimide compound, in Formula (1), $R^1$ and $R^2$ are both isopropyl groups; $X^1$ and $X^2$ each represent —$R^3$—NH—COO$R^4$, $R^3$ being a divalent residue obtained by removing two —OCN groups from 4,4'-diphenylmethane diisocyanate, 2,4-tolylene diisocyanate or 2,6-tolylene diisocyanate, $R^4$ being a residue obtained by removing a hydroxy group from a hydroxymethyl group or a hydroxyethyl group, $X^1$ and $X^2$ being same as or different from each other; Y represents —$R^5$—NHCOO—$R^6$—OCOHN—$R^5$—, each $R^5$ being independently a divalent residue obtained by removing two —OCN groups from 4,4'-diphenylmethane diisocyanate, 2,4-tolylene diisocyanate or 2,6-tolylene diisocyanate, and $R^6$ being a castor oil-based diol residue, a propanediol residue, a butanediol residue, or a polycarbonate diol residue; and n is an integer of 1 to 5.

In the present embodiment, the weight average molecular weight of the polycarbodiimide compound is 300 to 3,000. It is preferable that the weight average molecular weight of the polycarbodiimide compound is 300 or more since warping is less likely to occur during the curing of the photosensitive resin composition; and it is preferable that the weight average molecular weight of the polycarbodiimide compound is 3,000 or less since the development time can be shortened. Further, the weight average molecular weight of the polycarbodiimide compound is preferably in the range of 300 to 1,200 from the viewpoint of migration resistance.

In the present embodiment, the weight average molecular weight is a value measured using gel permeation chromatography in terms of polystyrene.

In addition, in the present embodiment, the equivalent number of the carbodiimide group in the polycarbodiimide compound is 150 to 600. When the equivalent number of the carbodiimide group is 150 or more, warping of the cured product can be reduced. When the equivalent number of the carbodiimide group is 600 or less, the desired crosslink density can be obtained to maintain migration resistance. In order to obtain further excellent migration resistance, the equivalent number of the carbodiimide group is preferably 400 or less and more preferably 300 or less.

As a method of producing the polycarbodiimide compound in the present embodiment, for example, the polycarbodiimide compound can be produced by a method of reacting a carbodiimide monomer containing at least two isocyanate groups in one molecule with a polyol having a hydroxy group at the molecular end to obtain a polycarbodiimide, reacting the obtained polycarbodiimide with a hydroxy group-containing monomer to cap an end isocyanate group of the polycarbodiimide, and reacting the end-capped polycarbodiimide with an amine to protect the carbodiimide group with the amino group.

The polycarbodiimide is obtained by a known method, and can be prepared, for example, by the method disclosed in Japanese Patent Application Laid-Open No. 2007-138080.

With the above method, it is possible to obtain a polycarbodiimide compound in which the carbodiimide group is protected by an amino group.

The amount of the polycarbodiimide compound to be used is preferably such that the equivalent of the carbodiimide group in the polycarbodiimide compound is 0.9 to 1.3 equivalents with respect to the carboxyl group in the photosensitive prepolymer. When the equivalent of the carbodiimide group is 0.9 or more with respect to 1 equivalent of the carboxyl group, the migration resistance can be sufficiently improved and the storage stability of the dry film can be improved. In addition, when the equivalent of the carbodiimide group is 1.3 or less with respect to 1 equivalent of the carboxyl group, the storage stability of the dry film can be maintained. The equivalent of the carbodiimide group is more preferably 1.0 or more, and more preferably 1.2 or less.

(Pigment)

In the present embodiment, as the pigment, pigments of various colors such as a purple pigment, a black pigment, a yellow pigment, a blue pigment, a green pigment, a red pigment and an orange pigment can be used. Examples of the structure thereof include organic pigments such as dioxazine-based one, azomethine azo-based one, phthalocyanine-based one, quinacridone-based one, benzimidazolone-based one, indanthrene-based one, perylene-based one, azo-based one, quinophthalone-based one, anthraquinone-based one, aniline-based one and cyanine-based one.

By containing an organic pigment in the photosensitive resin composition, when the photosensitive resin composition is formed to a film having a dry film thickness of 10 μm to 40 μm, a maximum value of the transmittance of the photosensitive resin composition can be 7% or more for the transmission spectrum of at least a part of a wavelength range of 350 nm to 430 nm, and thus it is possible to achieve both the concealability of the wiring pattern and the resolution of the wiring pattern and to further improve the insulation. The above pigment may be used alone, or may be used in combination of two or more thereof.

Hereinafter, specific examples of the pigment which can be used in the present embodiment are shown. "C. I." means color index.

<Purple Pigment>

Examples of the purple pigment include C. I. Pigment Violet 1, 1:1, 2, 2:2, 3, 3:1, 3:3, 5, 5:1, 14, 15, 16, 19, 23, 25, 27, 29, 31, 32, 37, 39, 42, 44, 47, 49, and 50. Among these, preferred are C. I. Pigment Violet 3, 15, 19, 23, 29, and 37.

<Black Pigment>

Examples of the black pigment include perylene black, azomethine azo black, cyanine black, aniline black, and lactam black. Among these, preferred are perylene black and azomethine azo black.

<Yellow Pigment>

Examples of the yellow pigment include C. I. Pigment Yellow 1, 1:1, 2, 3, 4, 5, 6, 9, 10, 12, 13, 14, 16, 17, 24, 31, 32, 34, 35, 35:1, 36, 36:1, 37, 37:1, 40, 41, 42, 43, 48, 53, 55, 61, 62, 62:1, 63, 65, 73, 74, 75, 81, 83, 87, 93, 94, 95, 97, 100, 101, 104, 105, 108, 109, 110, 111, 116, 117, 119, 120, 126, 127, 127:1, 128, 129, 133, 134, 136, 138, 139, 142, 147, 148, 150, 151, 153, 154, 155, 157, 158, 159, 160, 161, 162, 163, 164, 165, 166, 167, 168, 169, 170, 172, 173, 174, 175, 176, 180, 181, 182, 183, 184, 185, 188, 189, 190, 191, 191:1, 192, 193, 194, 195, 196, 197, 198, 199, 200, 202, 203, 204, 205, 206, 207, and 208. Among these, preferred are C. I. Pigment Yellow 139 and 185.

<Blue Pigment>

Examples of the blue pigment include C. I. Pigment Blue 1, 1:2, 9, 14, 15, 15:1, 15:2, 15:3, 15:4, 15:6, 16, 17, 19, 25, 27, 28, 29, 33, 35, 36, 56, 56:1, 60, 61, 61:1, 62, 63, 66, 67, 68, 71, 72, 73, 74, 75, 76, 78, and 79. Among these, preferred are C. I. Pigment Blue 15, 15:1, 15:2, 15:3, 15:4, 15:6, and 16.

<Green Pigment>

Examples of the green pigment include C. I. Pigment Green 1, 2, 4, 7, 8, 10, 13, 14, 15, 17, 18, 19, 26, 36, 45, 48, 50, 51, 54, and 55. Among these, preferred are C. I. Pigment Green 7.

<Red Pigment>

Examples of the red pigment include C. I. Pigment Red 1, 2, 3, 4, 5, 6, 7, 8, 9, 12, 14, 15, 16, 17, 21, 22, 23, 31, 32, 37, 38, 41, 47, 48, 48:1, 48:2, 48:3, 48:4, 49, 49:1, 49:2, 50:1, 52:1, 52:2, 53, 53:1, 53:2, 53:3, 57, 57:1, 57:2, 58:4, 60, 63, 63:1, 63:2, 64, 64:1, 68, 69, 81, 81:1, 81:2, 81:3, 81:4, 83, 88, 90:1, 101, 101:1, 104, 108, 108:1, 109, 112, 113, 114, 122, 123, 144, 146, 147, 149, 151, 166, 168, 169, 170, 172, 173, 174, 175, 176, 177, 178, 179, 181, 184, 185, 187, 188, 190, 193, 194, 200, 202, 206, 207, 208, 209, 210, 214, 216, 220, 221, 224, 230, 231, 232, 233, 235, 236, 237, 238, 239, 242, 243, 245, 247, 249, 250, 251, 253, 254, 255, 256, 257, 258, 259, 260, 262, 263, 264, 265, 266, 267, 268, 269, 270, 271, 272, 273, 274, 275, and 276. Among these, preferred is C. I. Pigment Red 122.

<Orange Pigment>

Examples of the orange pigment include C. I. Pigment Orange 1, 2, 5, 13, 16, 17, 19, 20, 21, 22, 23, 24, 34, 36, 38, 39, 43, 46, 48, 49, 61, 62, 64, 65, 67, 68, 69, 70, 71, 72, 73, 74, 75, 77, 78, and 79.

In the present embodiment, the above pigments may be appropriately combined to prepare a photosensitive resin composition exhibiting a desired color tone, and it is preferable that at least one pigment selected from the group consisting of a purple pigment and a black pigment is contained as a main pigment. By containing at least one pigment selected from the group consisting of a purple pigment and a black pigment in the photosensitive resin composition, it is easy to adjust the degree of blackness of a film formed by the photosensitive resin composition. The main pigment refers to the pigment in the largest proportion to the total mass of the pigments contained in the photosensitive resin composition.

Among the purple pigment and the black pigment, it is preferable to contain at least one selected from the group consisting of C. I. Pigment Violet 3, C. I. Pigment Violet 15, C. I. Pigment Violet 19, C. I. Pigment Violet 23, C. I. Pigment Violet 29, C. I. Pigment Violet 37, C. I. Pigment Violet 50, azomethine azo black, and perylene black.

In a case where the color tone of the photosensitive resin composition is not sufficient after containing the above main pigment, it is preferable to further contain at least one pigment selected from the group consisting of a yellow pigment, a blue pigment and a green pigment as a toning pigment. The toning pigment is preferably used in a ratio of 0.1 or more and less than 1.0, preferably 0.3 to 0.8 with respect to 1 part of the main pigment in terms of solid content.

The pigment used in the present embodiment preferably has a number average particle diameter of 0.001 μm to 0.1 μm and more preferably has a number average particle diameter of 0.01 μm to 0.08 μm from the viewpoint of dispersion stability. The "particle diameter" used here refers to a diameter of a circle having the same area as the electron micrograph image of the particle, and the "number average particle diameter" refers to the average value of the particle diameter calculated for 100 particles.

In the present embodiment, the pigment is preferably contained in a range of 1.0 mass % to 7.0 mass % in terms of solid content with respect to the total solid content of the photosensitive resin composition. When the solid content is 0.1 mass % or more with respect to the total solid content of the composition, the composition is excellent in dispersion stability and a film having desired transmittance can be obtained; when the solid content is 7.0 mass % or less, a film can be formed without causing curing failure or lowering of resolution.

The pigment is preferably used as a dispersion liquid. This dispersion liquid can be prepared by adding and dispersing a composition obtained by previously mixing a pigment and a dispersant to an organic solvent (or a vehicle). The vehicle refers to a portion of a medium in which the pigment is dispersed when a paint is in a liquid state, and contains a portion (binder) which is liquid and bonds to the pigment to harden the coating, and a component (organic solvent) which dissolves and dilutes the above portion.

(Other Colorants)

The photosensitive resin composition of the present embodiment may contain a colorant other than the pigment described above as long as the effects of the present embodiment are not impaired.

Examples of other colorants used in the present embodiment include: inorganic pigments such as carbon black, titanium black, carbon nanotube, acetylene black, strontium titanate, chromium oxide, cerium oxide, ultramarine blue, Prussia blue, yellow lead, zinc yellow, red lead, iron oxide red, zinc flower, lead white, lithopone, and titanium dioxide; and dyes such as nitroso dyes, nitro dyes, azo dyes, stilbene azo dyes, keto imine dyes, triphenylmethane dyes, xanthene dyes, acridine dyes, quinoline dyes, methine/polymethine dyes, thiazole dyes, indamine dyes, indophenol dyes, azine dyes, oxazine dyes, thiazine dyes, sulfur dyes, aminoketone dyes, oxyketone dyes, anthraquinone dyes, indigoid dyes, and phthalocyanine dyes.

(Photopolymerizable Compound)

In the present embodiment, the photosensitive resin composition may contain a photopolymerizable compound.

Examples of the photopolymerizable compound as the component in the present embodiment are not particularly limited as long as photocrosslinking can be obtained, and a compound having an ethylenically unsaturated bond can be preferably used. Examples of the compound having an ethylenically unsaturated bond in the molecule include a (meth)acrylate compounds, a bisphenol A di(meth)acrylate compound, an epoxy acrylate compound, a modified epoxy acrylate compound, a fatty acid modified epoxy acrylate compound, an amine modified bisphenol A epoxy acrylate compound, a hydrogenated bisphenol A di(meth)acrylate compound, a di(meth)acrylate compound having a urethane bond in the molecule, a (meth)acrylate compound having a hydrophobic skeleton in the molecule, a polyalkylene glycol di(meth)acrylate compound having both a (poly)oxyethylene chain and a (poly)oxypropylene chain in the molecule, a trimethylolpropane di(meth)acrylate compound, and a polyester acrylate compound. The above compound may be used alone, or may be used in combination of two or more thereof.

In the present embodiment, examples of a photopolymerizable compound which is preferably used include "EBECRYL-3708" and "EBECRYL-1039" (trade names, manufactured by DAICEL-ALLNEX LTD.), and "R-684", "HX-220", and "HX-620" (trade names, manufactured by Nippon Kayaku Co., Ltd.) as commercially available products.

The amount of the photopolymerizable compound to be used is preferably 10 parts by mass or more, more preferably 20 parts by mass or more, still more preferably 30 parts by mass or more, and is preferably 60 parts by mass or less, more preferably 50 parts by mass or less, still more preferably 40 parts by mass or less, with respect to 100 parts by mass of the photosensitive prepolymer. With respect to 100 parts by mass of the photosensitive prepolymer, when the content of the photopolymerizable compound is 10 parts by mass or more, the resolution during the preparation of the FPC can be improved and thus detailed circuit patterns can be drawn; and when the content thereof is 60 parts by mass or less, the cured film has flame retardance and heat resistance, which is thus preferred.

(Other Components)

The photosensitive resin composition of the present embodiment may contain other components as long as the desired effects of the present embodiment are not impaired. Examples of other components include a flame retardant, a plasticizer, and a filler.

Examples of the flame retardant include organic phosphinic acid-based flame retardants, metal oxides, phosphates, phosphazene compounds, salts of melamine and thermal condensates of melamine and polyphosphoric acid, and compounds of melamine and isocyanuric acid.

Examples of the plasticizer include p-toluenesulfonamide

Examples of the filler include silica, alumina, talc, calcium carbonate, and barium sulfate.

Other components may be used alone, or may be used in combination of two or more thereof.

The amount of other components to be used is preferably 5 parts by mass to 60 parts by mass, and more preferably 20 parts by mass to 40 parts by mass with respect to 100 parts by mass of the photosensitive prepolymer.

(Preparation of Photosensitive Resin Composition)

The method for preparing the photosensitive resin composition of the present embodiment can include a known method in the related-art, and is not particularly limited. For example, photosensitive resin composition can be prepared by sequentially mixing a photosensitive prepolymer with a photopolymerization initiator, a thermosetting agent, a pigment and other optional components.

The mixing step can be performed using mixers, such as a bead mill and a roll mill.

The photosensitive resin composition of the present embodiment may be liquid or film-like (film). A film-like photosensitive resin composition can be formed, for example, by applying the photosensitive resin composition of the present embodiment onto a film which has been subjected to a mold release treatment, and removing the solvent contained in the resin composition at a predetermined temperature. The application method can be appropriately selected according to the desired thickness such as a Comma Coater (registered trademark), a gravure coater, and a die coater.

When the photosensitive resin composition of the present embodiment is formed to a film having a dry film thickness of 10 μm to 40 μm, the maximum value of the transmittance of the photosensitive resin composition is 7% or more for the transmission spectrum of at least a part of a wavelength range of 350 nm to 430 nm, which is a reaction region of the photopolymerization initiator. When the maximum value of the transmittance is 7% or more, the exposure light can reach the bottom of the film during photo-curing, so that excellent resolution can be exhibited during the photo-curing. From the viewpoint of the stabilization of resolution, the maximum value of the transmittance of the photosensitive resin composition is preferably 8% or more, and more preferably 10% or more for the transmission spectrum of at least a part of a wavelength range of 350 nm to 430 nm. The transmittance for at least a part of a wavelength range of 350 to 430 nm is preferably as high as possible.

In addition, when the photosensitive resin composition of the present embodiment is formed to a film having a dry film thickness of 10 µm to 40 µm, the transmittance at a wavelength of 405 nm is preferably 6% or more. When the transmittance at a wavelength of 405 nm, which is one of the wavelengths at which the photopolymerization reaction starts, is 6% or more, the exposure sensitivity is improved.

The transmission spectrum in the present embodiment can be confirmed by, for example, preparing a film having an arbitrary thickness in the range of 10 µm to 40 µm using a photosensitive resin composition, and measuring the transmission spectrum of the obtained film using a spectrophotometer (for example, "U-4100 Spectro Photometer" (manufactured by Hitachi, Ltd.)).

In addition, when the photosensitive resin composition of the present embodiment is formed to a film having a dry film thickness of 10 µm to 40 µm, a brightness L* in an L*a*b* color system is preferably 30 or less. When the brightness L* of the film having a dry film thickness of 10 µm to 40 µm is 30 or less, the concealability can be maintained. From the viewpoint of concealability, the brightness L* of the film having a dry film thickness of 10 µm to 40 µm is preferably 25 or less and more preferably 22 or less.

In the photosensitive resin composition of the present embodiment, a brightness L* in the L*a*b* color system is preferably 30 or less on a surface of a film of the photosensitive resin composition having a cured film thickness of 10 µm to 40 µm formed on a glossy side of a copper foil having the glossy surface and a rough surface. When the brightness L* is 30 or less on the surface of the film of the photosensitive resin composition formed on the copper foil of the laminate, the wiring pattern made of a conductive material can be sufficiently concealed and visual recognition of the wiring pattern can be suppressed when the photosensitive resin composition is used as a solder resist for a wiring board, which is thus preferred. From the viewpoint of concealability, the brightness L* of the laminate on the surface of the film is preferably 28 or less and more preferably 25 or less.

The chromaticities a* and b* specified by the L*a*b* color system of the laminate on which a film of the photosensitive resin composition having a cured film thickness of 10 µm to 40 µm is formed on the glossy surface of the copper foil are not particularly limited, and each are preferably in the range of −5 to 5, and more preferably in the range of −3 to 3.

In the present embodiment, the L*a*b* color system shall conform to the regulations recommended by the International Commission on Illumination in 1976 or the provisions of JIS Z8729. Specifically, L*a*b* may be measured at a plurality of locations (for example, 3 points or more) on the film formed of the photosensitive resin composition or on the film-side surface of the laminate using a color difference meter (trade name "CR-400" manufactured by KONICA MINOLTA, INC.; Colorimeter), and the average value thereof may be adopted.

(Photosensitive Film)

The photosensitive film of the present embodiment includes a support and a photosensitive resin composition layer formed on the support, and the photosensitive resin composition layer contains the above photosensitive resin composition. The photosensitive film may have a protective film layer on the surface opposite to the support of the photosensitive resin composition layer.

According to the photosensitive film of the present embodiment, it is excellent in flexibility and a solder resist film can be easily formed after the photosensitive film is cured.

Hereinafter, a method for preparing the photosensitive film will be described.

The photosensitive resin composition layer is preferably formed by dissolving the photosensitive resin composition of the present embodiment in a solvent such as methanol, ethanol, acetone, methyl ethyl ketone, methyl cellosolve, ethyl cellosolve, toluene, N,N-dimethylformamide, and propylene glycol monomethyl ether or a mixed solvent thereof to form a solution having a solid content of about 30 mass % to 70 mass %, and then applying the solution onto a support.

Examples of the support include a polymer film having heat resistance and solvent resistance such as polyesters such as polyethylene terephthalate, polypropylene, and polyethylene. It is preferable that the surface of the support onto which the resin composition is applied be subjected to a release treatment.

The thickness of the support can be appropriately selected based on the application and the thickness of the resin composition.

The thickness of the photosensitive resin composition layer varies depending on the application, and the thickness after drying and removing the solvent by heating and/or hot air spraying is preferably 5 µm to 100 µm, and more preferably 10 µm to 50 µm.

Examples of the protective film include a polyethylene film, a polypropylene film, and a polyethylene terephthalate.

The photosensitive film of the present embodiment can be stored as it is and has storage stability of about 2 weeks or longer at normal temperature (23° C.).

The photosensitive film of the present embodiment can be used to form a resist pattern. The resist pattern can be produced by a production method including, for example: a lamination step of laminating a photosensitive film on a circuit forming substrate; an exposure step of irradiating a predetermined portion of a photosensitive resin composition layer with an actinic ray to form a cured portion on the photosensitive resin composition layer; a development step of removing the photosensitive resin composition layer excluding the cured portion; and a thermal curing step of curing the photosensitive resin composition layer of the cured portion by heating.

In a case where the photosensitive film has a protective film, a step of removing the protective film from the photosensitive film is included.

The circuit forming substrate includes an insulating layer and a conductor layer (a layer made of a conductive material such as copper, a copper-based alloy, silver, a silver-based alloy, nickel, chromium, iron, an iron-based alloy such as stainless steel, and preferably made of copper or a copper-based alloy) formed on the insulating layer by etching or printing. In the lamination step, the photosensitive resin composition layer of the photosensitive film is laminated on the conductor layer side of the circuit forming substrate.

Examples of a method for laminating the photosensitive film in the lamination step include a method of performing lamination by heating the photosensitive resin composition layer and compressing the same to the circuit forming substrate. In case of performing lamination in this manner, it is preferable to perform lamination under reduced pressure in terms of adhesion and followability.

In the lamination step, the heating of the photosensitive resin composition layer is preferably performed at a temperature of 30° C. or higher and lower than 80° C., the compression pressure is preferably about 0.1 MPa to 2.0 MPa, and the ambient pressure is preferably 3 hPa or less. When the heating temperature is 80° C. or higher, the amino group of the polycarbodiimide compound in photosensitive resin composition dissociates from carboxyl group, so that the lamination step is performed at a temperature lower than the dissociation temperature.

In the exposure step, a predetermined portion of the photosensitive resin composition layer is irradiated with an actinic ray to form a cured portion. Examples of a method for forming the cured portion include a method of imagewise performing irradiation with an actinic ray through a negative or positive mask pattern called artwork. In addition, it is also possible to perform exposure by a direct drawing method having no mask pattern such as an LDI (Laser Direct Imaging) method or a DLP (Digital Light Processing) (registered trademark) exposure method. At this time, in a case where the support present on the photosensitive resin composition layer is transparent, the irradiation can be performed with an actinic ray as it is. In a case where the support is opaque, the photosensitive resin composition layer is irradiated with an actinic ray after the support is removed.

As the light source of the actinic ray, a known light source can be used, for example, a light source effectively emitting ultraviolet rays, such as a carbon arc lamp, a mercury vapor arc lamp, an ultra-high pressure mercury lamp, a high pressure mercury lamp, a xenon lamp, and a semiconductor laser. In addition, a light source effectively emitting visible light can also be used, for example, a flood light bulb for a photo, and a sun lamp.

Next, in a case where a support is present on the photosensitive resin composition layer, the support is removed, and in the development step, the photosensitive resin composition layer excluding the cured portion is removed by wet development, dry development or the like to perform development to form a resist pattern.

In the case of wet development, the development can be performed by known methods such as spraying, rocking immersion, brushing, and scraping, using developing solutions such as alkaline aqueous solution. The developing solution is preferably safe and stable and has good operability. For example, a dilute solution (1 mass % to 5 mass % aqueous solution) of sodium carbonate at 20° C. to 50° C. is used.

In a case where the resist pattern obtained by the above formation method is used as, for example, a solder resist film of a flexible printed circuit, a heating and curing step is performed after the development step. With the heating and curing step, the amino group of the polycarbodiimide compound in the photosensitive resin composition of the photosensitive resin composition layer dissociates, and a cured film can be formed.

The heating method can include heating with an oven. As the heating condition, the heating is preferably performed at a temperature of 80° C. or higher for 20 minutes to 120 minutes. Since the amino group of the polycarbodiimide compound dissociates at 80° C. or higher, by performing heating at 80° C. or higher, the amino group can be dissociated from the carbodiimide group and reacted with the carboxyl group of the photosensitive prepolymer, so as to cure the photosensitive resin composition. The upper limit of heating temperature is not particularly limited, and for example, it is preferable to perform heating at 200° C. or lower from the viewpoint of working efficiency.

(Flexible Printed Circuit)

With the above method, a flexible printed circuit (FPC) including an insulating layer, a wiring pattern made of a conductive material and provided on the insulating layer, and a solder resist layer provided on the insulating layer is obtained, and an acylurea structure is formed in the solder resist layer by the reaction of the carbodiimide group with the carboxyl group. In the present embodiment, the FPC may further include a shield layer containing a conductive material on the solder resist layer.

Examples of the shield layer include those having a three-layer structure of insulating layer/metal layer/conductive adhesive layer, and a commercially available shield film can be used.

Examples of the conductive material constituting the shield layer include a metal. Examples of the metal include gold, silver, copper, aluminum, nickel and an alloy thereof.

In order to enhance the adhesiveness between the shield layer and the solder resist layer, for example, in the case of a shield layer having a three-layer structure, the conductive adhesive layer is provided in contact with the solder resist layer.

In the present embodiment, since the solder resist layer is formed of the photosensitive resin composition of the present embodiment, it is possible to obtain an FPC in which the wiring pattern is concealed and the resolution is also excellent.

In the present embodiment, it is preferable that, when a flexible printed circuit is prepared in which a solder resist layer is provided such that the interlayer distance between the wiring pattern and the shield layer is 10 μm in the film thickness after curing, and when the flexible printed circuit is subjected to continuous measurement of resistance while a voltage of 50 V is applied under an atmosphere of a temperature of 85° C. and a relative humidity of 85% RH, a resistance value keeps $1.0 \times 10^7 \Omega$ or more for 500 hours or longer.

When the above environmental resistance test is performed, it can be said that the solder resist has practically excellent migration resistance if the electrical insulation properties of the flexible printed circuit has a resistance value of $1.0 \times 10^7 \Omega$ or more for 500 hours or longer, and preferably the resistance value continues for 1,000 hours or longer.

(Image Display Device)

The image display device of the present embodiment includes the flexible printed circuit (FPC) of the present embodiment. The image display device of the present embodiment includes, for example, a liquid crystal display substrate including a liquid crystal display unit on the surface of a liquid crystal panel display, a printed substrate provided with a drive circuit for the liquid crystal display substrate, and a flexible printed circuit (FPC) for electrically connecting the liquid crystal display substrate and the printed substrate, and the flexible printed circuit of the present embodiment is used as the FPC.

The liquid crystal display substrate is formed by sealing a liquid crystal for forming a display region including a large number of pixel arrays between two insulating glass-based substrates, and one surface thereof forms a liquid crystal display portion. The printed substrate is a so-called control substrate on which a control IC for driving and controlling a touch sensor module is mounted.

The flexible printed circuit (FPC) of the present embodiment has one end adhered to the liquid crystal display substrate and the other end adhered to the printed substrate, and the liquid crystal display substrate and the printed substrate are electrically connected by the FPC of the present embodiment.

EXAMPLES

Hereinafter, the present invention is specifically described by way of Examples and Comparative Examples, but the present invention is not limited thereto.

Examples 1 to 14 and Comparative Examples 1 to 2

(i) Preparation of Photosensitive Resin Composition

Respective components were blended at the blending ratio shown in Table 1 and Table 2 and mixed by a mixer to obtain photosensitive resin compositions of Examples 1 to 14 and Comparative Examples 1 to 2.

(ii) Preparation of Dry Film

The photosensitive resin composition obtained in the above (i) was applied onto a 25 μm thick polyethylene terephthalate (PET) film such that the thickness after drying was as shown in the table. The photosensitive resin composition was dried at 80° C. for 5 minutes, and then a polyethylene film was attached to the photosensitive resin composition on the applied side, so as to obtain a dry film of the photosensitive resin composition.

<Measurement of Transmittance and L* Value for Dry Film before Curing>

(1) Preparation of Test Sample

The polyethylene terephthalate film was peeled off from the dry film prepared in the above (ii), and the dry film was attached to a 25 μm thick polyethylene terephthalate (PET) film by vacuum lamination to prepare an attaching test sample. The vacuum lamination was performed at a hot plate temperature of 50° C. to 70° C., a press pressure of 0.5 MPa to 1.0 MPa, a press time of 10 seconds to 20 seconds, and a vacuum degree of 3 hPa or less.

(2) Measurement Method

For the test sample, the maximum value of the transmittance in the wavelength range of 350 nm to 430 nm, the transmittance at a wavelength of 405 nm, and the brightness L* were measured using a spectrophotometer "U-4100 Spectro Photometer" (manufactured by Hitachi, Ltd.) equipped with a 60φ integrating sphere.

<Measurement of L* Value for Dry Film after Curing>

(1) Preparation of Test Sample

The polyethylene film was peeled of from the dry film prepared in the above (ii), and the dry film was attached to a 35 μm thick rolled copper foil by vacuum lamination. The vacuum lamination was performed at a hot plate temperature of 50° C. to 70° C., a press pressure of 0.5 MPa to 1.0 MPa, a press time of 10 seconds to 20 seconds, and a vacuum degree of 3 hPa or less. After vacuum lamination, irradiation was performed using ultraviolet rays of 300 mJ/cm$^2$ with an extra-high pressure mercury lamp. After irradiation, the PET film was peeled off, the development was performed by a spraying 1 wt % aqueous solution of sodium carbonate at 30° C. for 60 seconds under a spray pressure of 0.18 MPa. After development, irradiation was performed using ultraviolet rays of 1,000 mJ/cm$^2$ with a high pressure mercury lamp. After irradiation, curing was performed at 150° C. for 90 minutes with a hot air circulating dryer, so as to obtain a test sample.

(2) Measurement Method

For the test sample, the brightness L* and the chromaticities a* and b* were measured using a color difference meter "CR-400" (manufactured by KONICA MINOLTA, INC.).

<Concealability>

(1) Preparation of Test Sample

A flexible copper clad laminate ("PNS H1012RAH" manufactured by Arisawa Manufacturing Co., Ltd.) was prepared in which a copper straight circuit pattern having a thickness of 12 μm, a line width of 30 μm, and a space width of 30 μm was provided on one side of a 25 μm thick polyimide substrate. The polyethylene film was peeled off from the dry film prepared in the above (ii) and the dry film was attached to the flexible copper clad laminate by vacuum lamination. The vacuum lamination was performed at a hot plate temperature of 50° C. to 70° C., a press pressure of 0.5 MPa to 1.0 MPa, a press time of 10 seconds to 20 seconds, and a vacuum degree of 3 hPa or less. After vacuum lamination, irradiation was performed using ultraviolet rays of 300 mJ/cm$^2$ with an extra-high pressure mercury lamp. After irradiation, the PET film was peeled off, the development was performed by a spraying 1 wt % aqueous solution of sodium carbonate at 30° C. for 60 seconds under a spray pressure of 0.18 MPa. After development, irradiation was performed using ultraviolet rays of 1,000 mJ/cm$^2$ with a high pressure mercury lamp. After irradiation, curing was performed at 150° C. for 90 minutes with a hot air circulating dryer.

(2) Measurement Method and Determination Criteria

The prepared test sample was observed visually and with an optical microscope (50×), and the concealability was evaluated based on whether the copper circuit pattern could be confirmed through the dry film.

(Evaluation Criteria)

⊚: It is difficult to confirm the copper circuit pattern even with an optical microscope.

○: the copper circuit pattern can be confirmed with an optical microscope, but it is difficult to confirm visually.

x: The presence or absence of the copper circuit pattern can be confirmed visually.

<Resolution (Patterning Properties)>

(1) Preparation of Test Sample

The polyethylene film was peeled off from the dry film prepared in the above (ii), and the dry film was attached to a 35 μm thick rolled copper foil by vacuum lamination to prepare an attaching test sample. The vacuum lamination was performed at a hot plate temperature of 50° C. to 60° C., a press pressure of 0.5 MPa to 1.0 MPa, a press time of 10 seconds to 20 seconds, and a vacuum degree of 3 hPa or less.

(2) Measurement Method and Determination Criteria

Irradiation was performed with ultraviolet rays of 300 mJ/cm$^2$ using an ultra-high pressure mercury lamp through a photomask on which a predetermined pattern (L/S=30/300 μm, 40/300 μm, 50/300 μm, 60/300 μm, 70/300 μm, 80/300 μm, 90/300 μm, 100/300 μm) was formed. After irradiation, the PET film was peeled off, and the dry film was developed at 30° C. for 60 seconds by spraying a 1 wt % aqueous solution of sodium carbonate under a spray pressure of 0.18 MPa. The resolution was evaluated according to the following criteria.

(Evaluation Criteria)

The resolution was determined based on the presence or absence of line peeling or fluctuation.

⊚: No line peeling or fluctuation at L/S=30/300 μm to 100/300 μm.

○: No line peeling or fluctuation at L/S=60/300 μm to 100/300 μm.

Δ: No line peeling or fluctuation at L/S=80/300 μm to 100/300 μm.

x: Line peeling or fluctuation occurs even at L/S=100/300 μm.

The above results are shown in Table 1 and Table 2.

TABLE 1

(Unit: parts by mass)

| | | Example 1 | Example 2 | Example 3 | Example 4 | Example 5 | Example 6 | Example 7 | Example 8 |
|---|---|---|---|---|---|---|---|---|---|
| Composition | Photosensitive prepolymer (A) | 100 | 100 | 100 | 100 | 100 | 100 | 100 | 100 |
| | Polycarbodiimide (1) (B) (lower part: equivalent number to carboxyl group of photosensitive prepolymer) | 107.1 / 1.0 eq | 107.1 / 1.0 eq | 107.1 / 1.0 eq | 107.1 / 1.0 eq | 107.1 / 1.0 eq | 107.1 / 1.0 eq | — | — |
| | Polycarbodiimide (2) (C) (lower part: equivalent number to carboxyl group of photosensitive prepolymer) | — | — | — | — | — | — | 107.1 / 1.0 eq | — |
| | Polycarbodiimide (3) (D) (lower part: equivalent number to carboxyl group of photosensitive prepolymer) | — | — | — | — | — | — | — | 53.6 / 1.0 eq |
| | Photopolymerization initiator (E) | 6 | 6 | 6 | 6 | 6 | 6 | 6 | 6 |
| | Modified epoxy acrylate (F) | 20 | 20 | 20 | 20 | 20 | 20 | 20 | 20 |
| | Purple pigment (G) | 7.0 | 4.3 | 4.0 | 4.0 | 3.9 | 3.4 | 3.4 | 2.6 |
| | Black pigment (H) | — | — | — | — | — | — | — | — |
| | Black pigment (I) | — | — | — | — | — | — | — | — |
| | Black pigment (J) | — | — | — | — | — | — | — | — |
| | Yellow pigment (K) | — | 1.5 | 1.5 | 1.9 | 2.0 | 1.6 | 1.6 | 1.2 |
| | Blue pigment (L) | — | 1.2 | 1.5 | 1.1 | 1.1 | 0.9 | 0.9 | 0.7 |
| | Ratio of main pigment to all solid content (%) | 2.92 | 1.79 | 1.67 | 1.67 | 1.62 | 1.42 | 1.42 | 1.42 |
| | Ratio of toning pigment to all solid content (%) | 0 | 1.12 | 1.25 | 1.25 | 1.29 | 1.06 | 1.06 | 1.06 |
| | Ratio of pigment to all solid content (%) | 2.92 | 2.91 | 2.91 | 2.91 | 2.92 | 2.48 | 2.48 | 2.48 |
| | Dry film thickness (μm) | 25 | 25 | 25 | 25 | 25 | 25 | 25 | 25 |
| Evaluation | Before curing — Maximum value of transmittance in range of 350 nm to 430 nm (%) | 37.6 | 13.3 | 11.3 | 8.5 | 7.3 | 12.0 | 12.8 | 12.9 |
| | Before curing — Transmittance at 405 nm (%) | 28.0 | 9.5 | 8.6 | 6.5 | 6.0 | 9.2 | 9.2 | 9.2 |
| | Before curing — L* | 12.6 | 15.9 | 13.5 | 13.5 | 12.5 | 21.0 | 21.0 | 20.9 |
| | After curing — L* | 26.3 | 26.2 | 25.8 | 26.2 | 26.1 | 22.1 | 22.0 | 22.1 |
| | After curing — a* | 7.6 | 1.7 | 1.4 | 1.6 | 1.5 | 1.5 | 1.5 | 1.5 |
| | After curing — b* | −3.1 | −0.3 | −0.7 | 0.3 | 0.5 | −0.3 | −0.3 | −0.3 |
| | Concealability | ◎ | ◎ | ◎ | ◎ | ◎ | ◎ | ◎ | ◎ |
| | Resolution | ◎ | ◎ | ◎ | ○ | ○ | ◎ | ◎ | ◎ |

(A): Carboxylic acid modified bisphenol type epoxy acrylate: Mw = 12,000, acid value = 100 mg KOH/g
(B): Castor oil-based diol based polycarbodiimide blocked with amine dissociating at 110° C. (eq = 600 g/eq, difunctional, Mw = 1,200)
(C): Carbonate-based diol based polycarbodiimide blocked with amine dissociating at 110° C. (eq = 600 g/eq, difunctional, Mw = 1,200)
(D): Castor oil-based diol based polycarbodiimide blocked with amine dissociating at 110° C. (eq = 300 g/eq, difunctional, Mw = 600)
(E): 2,4,6-trimethyl benzoyl diphenyl phosphine oxide
(F): "EBECRYL-3708" (trade name) manufactured by DAICEL-ALLNEX LTD (Mw = 1,500, difunctional)
(G): Dioxazine violet (Pigment violet 37)
(H): Azomethine azo
(I): Perylene black (FK-4280), no color index
(J): Perylene black (FK-4281), no color index
(K): Isoindoline
(L): Phthalocyanine blue

TABLE 2

(Unit: part by mass)

| | | Example 9 | Example 10 | Example 11 | Example 12 | Example 13 | Example 14 | Comparative Example 1 | Comparative Example 2 |
|---|---|---|---|---|---|---|---|---|---|
| Composition | Photosensitive prepolymer (A) | 100 | 100 | 100 | 100 | 100 | 100 | 100 | 100 |
| | Polycarbodiimide (1) (B) (lower part: equivalent number to carboxyl group of photosensitive prepolymer) | 107.1 / 1.0 eq | 107.1 / 1.0 eq | 107.1 / 1.0 eq | 107.1 / 1.0 eq | 107.1 / 1.0 eq | 107.1 / 1.0 eq | 107.1 / 1.0 eq | 107.1 / 1.0 eq |
| | Polycarbodiimide (2) (C) (lower part: equivalent number to carboxyl group of photosensitive prepolymer) | — | — | — | — | — | — | — | — |
| | Polycarbodiimide (3) (D) (lower part: equivalent number to carboxyl group of photosensitive prepolymer) | — | — | — | — | — | — | — | — |
| | Photopolymerization initiator (E) | 6 | 6 | 6 | 6 | 6 | 6 | 6 | 6 |
| | Modified epoxy acrylate (F) | 20 | 20 | 20 | 20 | 20 | 20 | 20 | 20 |
| | Purple pigment (G) | 8.5 | 2.1 | 4.0 | — | — | — | 4.0 | — |
| | Black pigment (H) | — | — | — | 7.0 | — | — | — | — |
| | Black pigment (I) | — | — | — | — | 7.0 | — | — | — |
| | Black pigment (J) | — | — | — | — | — | 7.0 | — | — |

TABLE 2-continued

|  |  |  | Example 9 | Example 10 | Example 11 | Example 12 | Example 13 | Example 14 | Comparative Example 1 | Comparative Example 2 |
|---|---|---|---|---|---|---|---|---|---|---|
|  | Yellow pigment (K) |  | 4.0 | 1.0 | — | — | — | — | 3.0 | 7.0 |
|  | Blue pigment (L) |  | 2.3 | 0.6 | 3.0 | — | — | — | — | — |
|  | Ratio of main pigment to all solid content (%) |  | 3.43 | 0.89 | 1.67 | 2.92 | 2.92 | 2.92 | 1.67 | 0.00 |
|  | Ratio of toning pigment to all solid content (%) |  | 2.55 | 0.68 | 1.25 | 0.00 | 0.00 | 0.00 | 1.25 | 2.92 |
|  | Ratio of pigment to all solid content (%) |  | 5.98 | 1.56 | 2.92 | 2.92 | 2.92 | 2.92 | 2.92 | 2.92 |
|  | Dry film thickness (μm) |  | 10 | 45 | 25 | 25 | 25 | 25 | 25 | 25 |
| Evaluation | Before curing | Maximum value of transmittance in range of 350 nm to 430 nm (%) | 12.8 | 12.9 | 34.7 | 9.1 | 23.9 | 15.5 | 6.6 | 1.7 |
|  |  | Transmittance at 405 nm (%) | 9.2 | 9.2 | 19.8 | 8.7 | 13.5 | 12.6 | 5.6 | 0.5 |
|  |  | L* | 21.1 | 21.0 | 20.5 | 28.7 | 22.0 | 27.4 | 22.5 | 73.7 |
|  | After curing | L* | 22.0 | 22.1 | 22.0 | 23.0 | 25.7 | 25.6 | 24.1 | 69.6 |
|  |  | a* | 1.5 | 1.5 | 8.7 | 3.8 | 1.8 | 0.9 | 14.0 | 29.7 |
|  |  | b* | −0.4 | −0.3 | −16.0 | 0.4 | −1.1 | 0.2 | 2.7 | 82.4 |
|  |  | Concealability | ◎ | ◎ | ◎ | ○ | ◎ | ○ | ○ | X |
|  |  | Resolution | ◎ | ◎ | ◎ | ○ | ◎ | ◎ | Δ | X |

(A): Carboxylic acid modified bisphenol type epoxy acrylate: Mw = 12,000, acid value = 100 mg KOH/g
(B): Castor oil-based diol based polycarbodiimide blocked with amine dissociating at 110° C. (eq = 600 g/eq, difunctional, Mw = 1,200)
(C): Carbonate-based diol based polycarbodiimide blocked with amine dissociating at 110° C. (eq = 600 g/eq, difunctional, Mw = 1,200)
(D): Castor oil-based diol based polycarbodiimide blocked with amine dissociating at 110° C. (eq = 300 g/eq, difunctional, Mw = 600)
(E): 2,4,6-trimethyl benzoyl diphenyl phosphine oxide
(F): "EBECRYL-3708" (trade name) manufactured by DAICEL-ALLNEX LTD (Mw = 1,500, difunctional)
(G): Dioxazine violet (Pigment violet 37)
(H): Azomethine azo
(I): Perylene black (FK-4280), no color index
(J): Perylene black (FK-4281), no color index
(K): Isoindoline
(L): Phthalocyanine blue As can be seen from Tables 1 and 2, since in Examples 1 to 14, the maximum value of the transmittance of the photosensitive resin composition is 7% or more for the transmission spectrum of at least a part of the wavelength range of 350 nm to 430 nm when the photosensitive resin composition is formed to a film having a dry film thickness of 10 μm to 40 μm, excellent resolution can be exhibited during the photo-curing. In addition, since the L* value is 30 or less for both the film having a dry film thickness of 10 μm to 40 μm and the dry film after curing of the photosensitive resin composition, a film excellent in concealability can be obtained.

While the present invention has been described in detail and with reference to specific embodiments thereof, it is apparent to one skilled in the art that various changes and modifications can be made therein without departing from the spirit and scope of the invention. This application is based on a Japanese patent application (Japanese Patent Application No. 2017-020628) filed on Feb. 7, 2017 and a Japanese patent application (Japanese Patent Application No. 2017-216564) filed on Nov. 9, 2017, the contents of which are incorporated herein by reference.

INDUSTRIAL APPLICABILITY

The flexible printed circuit including the solder resist layer formed using the photosensitive resin composition of the present invention can be suitably used as an electronic material component to be used in an electronic device to which miniaturization and thinning are required.

The invention claimed is:

1. A photosensitive resin composition containing:
a photosensitive prepolymer having a carboxyl group and an ethylenically unsaturated group;
a photopolymerization initiator;
a thermosetting agent; and
a pigment,
wherein the thermosetting agent is a polycarbodiimide compound represented by the following Formula (1) in which carbodiimide group is protected by an amino group dissociating at a temperature of 80° C. or higher, the polycarbodiimide compound having a weight average molecular weight of 300 to 3,000 and a carbodiimide equivalent of 150 to 600,
wherein a maximum value of a transmittance of the photosensitive resin composition is 7% or more for a transmission spectrum of at least a part of a wavelength range of 350 nm to 430 nm when formed to a film having a dry film thickness of 10 μm to 40 μm, and
wherein a brightness L* in an L*a*b* color system is 30 or less when the photosensitive resin composition is formed to the film having the dry film thickness of 10 μm to 40 μm;

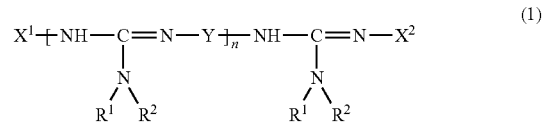

wherein, in Formula (1), $R^1$ and $R^2$ each independently represents a hydrogen atom, a linear or branched alkyl group having 1 to 6 carbon atoms, or a cycloalkyl group having 3 to 6 carbon atoms, $R^1$ and $R^2$ may be same as or different from each other, but both of them are not hydrogen atoms at the same time;

$X^1$ and $X^2$ each represents —$R^3$—NH—COOR$^4$, $R^3$ being a divalent organic group having at least one aromatic group and $R^4$ being a residue obtained by removing a hydroxy group from an organic group having one hydroxy group, and $X^1$ and $X^2$ being same as or different from each other;

Y represents —$R^5$—NHCOO—$R^6$—OCOHN—$R^5$—, each $R^5$ being independently a divalent organic group having at least one aromatic group and $R^6$ being a divalent organic group, $R^6$ not being an ether bond; and n represents an integer of 1 to 5.

2. The photosensitive resin composition according to claim 1, wherein the brightness L* in the L*a*b* color system is 30 or less at a surface of the film of the photosensitive resin composition having a cured film thickness of 10 μm to 40 μm formed on a glossy side of a copper foil.

3. The photosensitive resin composition according to claim 1, wherein the pigment contains, as a main pigment, at least one selected from the group consisting of C. I. Pigment Violet 3, C. I. Pigment Violet 15, C. I. Pigment Violet 19, C. I. Pigment Violet 23, C. I. Pigment Violet 29, C. I. Pigment Violet 37, C. I. Pigment Violet 50, azomethine azo black, and perylene black.

4. The photosensitive resin composition according to claim 3, wherein the pigment further contains, as a toning pigment, at least one selected from the group consisting of a yellow pigment, a blue pigment and a green pigment.

5. The photosensitive resin composition according to claim 1, wherein the pigment is contained in an amount of 1.0 mass % to 7.0 mass % in terms of solid content with respect to a total solid content of the composition.

6. The photosensitive resin composition according to claim 1, wherein the polycarbodiimide compound has 2 to 6 carbodiimide groups.

7. The photosensitive resin composition according to claim 1, wherein the carbodiimide equivalent of the polycarbodiimide compound is 0.9 to 1.3 equivalents with respect to the carboxyl group of the photosensitive prepolymer.

8. The photosensitive resin composition according to claim 1, which is used for a solder resist film.

9. A solder resist film containing the photosensitive resin composition according to claim 1.

10. A flexible printed circuit comprising:
an insulating layer;
a wiring pattern made of a conductive material and provided on the insulating layer; and
a solder resist layer provided on the wiring pattern,
wherein the solder resist layer contains the photosensitive resin composition according to claim 1.

11. An image display device, including the flexible printed circuit according to claim 10.

* * * * *